(12) United States Patent
Jang et al.

(10) Patent No.: US 10,755,855 B2
(45) Date of Patent: Aug. 25, 2020

(54) CAPACITOR AND METHOD OF MANUFACTURING THE SAME

(71) Applicant: SAMSUNG ELECTRO-MECHANICS CO., LTD., Suwon-si, Gyeonggi-do (KR)

(72) Inventors: Chang Soo Jang, Suwon-si (KR); Yun Hee Kim, Suwon-si (KR); Woong Do Jung, Suwon-si (KR); Jeong Hoon Ryou, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/107,803

(22) Filed: Aug. 21, 2018

(65) Prior Publication Data

US 2019/0237252 A1    Aug. 1, 2019

(30) Foreign Application Priority Data

Jan. 31, 2018  (KR) .................. 10-2018-0011844

(51) Int. Cl.
*H01G 4/008* (2006.01)
*H01G 4/012* (2006.01)
*H01G 4/08* (2006.01)

(52) U.S. Cl.
CPC ............ *H01G 4/012* (2013.01); *H01G 4/008* (2013.01); *H01G 4/08* (2013.01)

(58) Field of Classification Search
CPC .......... H01G 4/008; H01G 4/012; H01G 4/08; H01G 4/33; H01G 4/06; H01L 21/823807; H01L 21/84; H01L 27/0629; H01L 27/10829; H01L 27/1087; H01L 27/10894;
(Continued)

(56) References Cited

U.S. PATENT DOCUMENTS

2001/0020713 A1* 9/2001 Yoshitomi ........... H01L 27/0629
257/306
2004/0157163 A1* 8/2004 Chen ................. H01L 21/31144
430/311
(Continued)

FOREIGN PATENT DOCUMENTS

JP    2005-209672 A    8/2005
JP    2009-246180 A    10/2009
KR    10-2009-0083568 A    8/2009

OTHER PUBLICATIONS

Office Action issued in corresponding Korean Application No. 10-2018-0011844, dated Mar. 31, 2019.

*Primary Examiner* — Timothy J Thompson
*Assistant Examiner* — Guillermo J Egoavil
(74) *Attorney, Agent, or Firm* — Morgan, Lewis & Bockius LLP

(57) ABSTRACT

Provided is a capacitor including a substrate including first and second trenches spaced apart from each other, a first electrode disposed in the first trench and one surface of the substrate, a second electrode disposed in the second trench and on the one surface of the substrate and spaced apart from the first electrode, first and second pad electrodes arranged on the first and second electrodes, respectively, and a passivation layer disposed on the first and second pad electrodes and having openings partially exposing the first and second pad electrodes, respectively.

16 Claims, 6 Drawing Sheets

(58) Field of Classification Search
CPC ........... H01L 27/10897; H01L 27/1203; H01L 29/66181
USPC ............................... 361/301.4, 311; 438/388
See application file for complete search history.

(56) References Cited

U.S. PATENT DOCUMENTS

| | | | |
|---|---|---|---|
| 2008/0153244 A1* | 6/2008 | Shih | H01L 23/5223 438/381 |
| 2009/0176347 A1* | 7/2009 | Cheng | H01L 21/823807 438/388 |
| 2009/0244808 A1* | 10/2009 | Ohtsuka | H01G 4/06 361/311 |
| 2014/0070292 A1* | 3/2014 | Cheng | H01L 21/84 257/301 |
| 2015/0076657 A1* | 3/2015 | Chou | H01L 27/0805 257/532 |
| 2019/0237251 A1* | 8/2019 | Jang | H01G 4/085 |

* cited by examiner

CAPACITOR AND METHOD OF MANUFACTURING THE SAME

CROSS-REFERENCE TO RELATED APPLICATION(S)

This application claims benefit of priority to Korean Patent Application No. 10-2018-0011844 filed on Jan. 31, 2018 in the Korean Intellectual Property Office, the disclosure of which is incorporated herein by reference in its entirety.

TECHNICAL FIELD

The present disclosure relates to a capacitor and a method of manufacturing the same.

BACKGROUND

Recently, applications requiring high-capacity data transmissions, such as virtual reality (VR) and three-dimensional (3D) holograms, have become commercially available. For high-capacity data transmissions, 5th generation (5G) mobile communications are required and, thus, recently, there has been an increasing need for 5G mobile communications.

Thus far, a 5G mobile communications frequency band has not been clearly determined but a high frequency of several tens of GHz is expected to be used. Accordingly, a capacitor for radio frequency (RF) matching of 5G mobile communications is expected to have a high resonant frequency of 30 GHz or more and a capacity of a level of 1 pF.

In general, a capacitor has the property of an inductor in such a high frequency and, thus, it is known that the capacitor is replaced with a simple metal pattern such as a microstrip.

However, when a microstrip is designed to be installed in a circuit board in reality, an entire package is discarded due to failure in a pattern of the microstrip and, thus, there is a problem in which a yield is remarkably lowered.

In the case of a typical multilayer ceramic capacitor (MLCC) manufactured via power sintering, there is a problem in that it is difficult to embody a capacitor with a high resonant frequency and low capacity due to a distance between input and output terminals according to a limitation in chip design.

Accordingly, there is a need to develop a high-frequency RF matching capacitor that has a high resonant frequency and low capacity, is separately manufactured, and is installed on a circuit board.

SUMMARY

An aspect of the present disclosure may provide a high-frequency radio frequency (RF) matching capacitor that has a high resonant frequency and low capacity, is separately manufactured, and is installed on a circuit board.

Another aspect of the present disclosure may provide a capacitor, for minimizing an interval between pad electrodes and minimizing a current path to achieve low equivalent series inductance (ESL).

According to an exemplary embodiment in the present disclosure, a capacitor includes a substrate including first and second trenches spaced apart from each other, a first electrode disposed in the first trench and on one surface of the substrate, a second electrode disposed in the second trench and on the one surface of the substrate and spaced apart from the first electrode, first and second pad electrodes arranged on the first and second electrodes, respectively, and a passivation layer disposed on the first and second pad electrodes and having openings partially exposing the first and second pad electrodes, respectively.

According to another exemplary embodiment in the present disclosure, a method of manufacturing a capacitor includes preparing a substrate, forming first and second trenches apart from each other in the substrate, forming an electrode in the first and second trenches and on one surface of the substrate and forming a pad electrode on the electrode, removing a portion of the pad electrode to divide the pad electrode into first and second pad electrodes and removing a portion of the electrode to divide the electrode into first and second electrodes, forming a passivation layer to cover the first and second pad electrodes, and removing portions of the passivation layer to partially expose the first and second pad electrodes.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
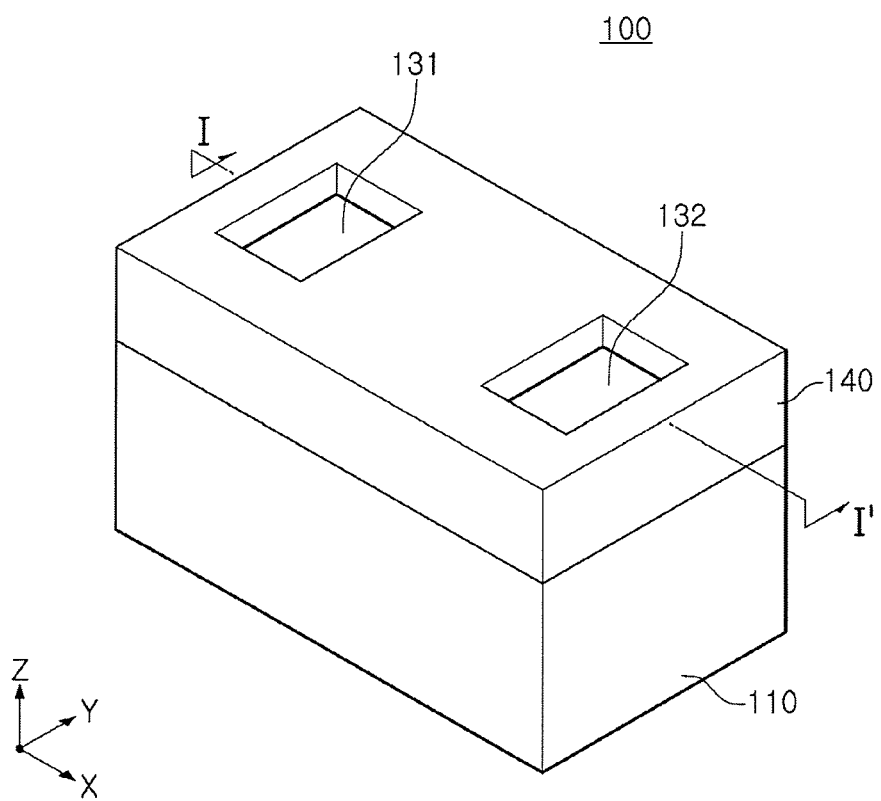
FIG. 1 is a schematic perspective view of a capacitor according to an embodiment of the present disclosure.

Reference will now be made in detail to the embodiments, examples of which are illustrated in the accompanying drawings. However, the present disclosure may be embodied in many different forms and should not be construed as being limited to the embodiments set forth herein. These embodiments are provided so that this disclosure will be thorough and complete, and will fully convey the concept of the present disclosure to those skilled in the art. In the drawings, the shapes and sizes of elements are exaggerated for clarity. The same reference numerals in the drawings denote elements with the same function within the scope in the drawings.

To clearly describe the present disclosure, in the drawings, portions not concerning the description may be omitted, thicknesses of some layers and regions may be exaggerated for descriptive convenience, and the same reference numerals in the drawings denote elements with the same function within the scope of the present disclosure. In addition, when a certain part "includes" a certain component, this indicates that the part may further include another component instead of excluding another component unless there is no different disclosure.

In the drawings, an X-axis direction is defined as a first direction or a longitudinal direction, a Y-axis direction is defined as a second direction or a width direction, and a Z-axis direction is defined as a third direction or a thickness direction.

Figure 2:
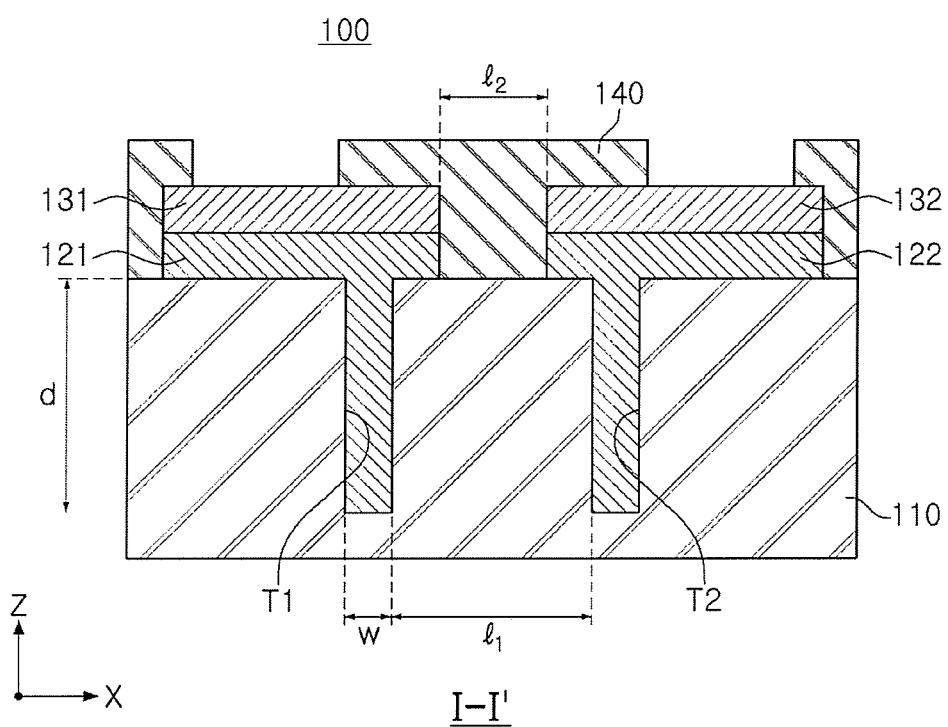
FIG. 2 is a cross-sectional view taken along line I-I' of FIG. 1.

FIG. 1 is a schematic perspective view of a capacitor according to an embodiment of the present disclosure. FIG. 2 is a cross-sectional view taken along line I-I' of FIG. 1.

Referring to FIGS. 1 and 2, a capacitor 100 according to an embodiment of the present disclosure may include a substrate 110 including first and second trenches T1 and T2 spaced apart from each other, a first electrode 121 disposed in the first trench T1 and on one surface of the substrate, a second electrode 122 disposed in the second trench T2 and on one surface of the substrate and spaced apart from the first electrode, first and second pad electrodes 131 and 132 arranged on the first and second electrodes 121 and 122, respectively, and a passivation layer 140 disposed to cover the first and second electrodes 121 and 122 and the first and second pad electrodes 131 and 132, through which the first and second pad electrodes 131 and 132 are partially exposed.

The substrate 110 may have, but is not limited to, a substantially hexahedral shape. In addition, the substrate 110 may have a predetermined size but is not particularly limited and, for example, may be a capacitor of 0402 size, 0.4 mm×0.2 mm×0.2 mm in length×width×thickness including the passivation layer 140 formed on the substrate 110.

The substrate 110 may be formed of a dielectric material or silicon (Si) with high resistance but the present disclosure is not limited thereto. For example, the substrate 110 may be formed of any one selected from the group consisting of Si, $SiO_2$, $Al_2O_3$, MgO, $LaAlO_3$, and $SrTiO_3$ and or a combination thereof.

The substrate 110 may include first and second trenches T1 and T2 spaced apart from each other.

The trench refers to a structure formed by interpenetrating into the substrate 110 from one surface of the substrate 110 in a depth direction (z-axis direction) by a predetermined depth.

In the case of a typical multilayer ceramic capacitor (MLCC) manufactured via power sintering, it is possible to embody capacity in a level of 1 pF, but even if an MLCC with a 0402 size that is the smallest size is assumed, a distance between input and output terminals is 400 μm and, thus, it is not possible to ensure a high resonant frequency.

On the other hand, the present disclosure may provide a capacitor for minimizing a distance $l_2$ by which first and second electrodes are spaced apart from each other on a substrate and minimizing a current path by using a trench to lower equivalent series inductance (ESL) and to achieve a high resonant frequency and low capacity.

As shown in FIG. 2, a structure in which the first and second trenches T1 and T2 do not penetrate into the substrate may advantageously compensate for adhesive force between the first and second electrodes 121 and 122 and the substrate 110.

A depth d of the trenches T1 and T2, a length (not shown) of a trench in a width direction (Y-axis direction), and a distance l1 by which the first and second trenches are spaced apart from each other may be designed in consideration of a requested capacitor capacity, a package thickness, and so on.

For example, a capacitor with a capacity of 1.04 pF may be achieved by using a substrate formed of Si with a specific inductive capacity of 11.7, setting a depth d of a trench to 100 μm, setting a length of the trench in a width direction (Y-axis direction) to 200 μm, and setting the distance $l_1$ by which the first and second trenches are spaced from each other to be 0.2 μm.

The distance $l_1$ by which the first and second trenches T1 and T2 are spaced apart from each other may not be particularly limited but, for example, in the case of a substrate formed of Si with a specific inductive capacity of 11.7, the distance l1 by which the first and second trenches T1 and T2 are spaced apart from each other may be 150 nm to 2 μm.

When the distance $l_1$ by which the first and second trenches T1 and T2 are spaced apart from each other is less than 150 nm, there may be a concern that a lateral wall of a trench may easily collapse, even by a small amount of force and, when the distance l1 by which the first and second trenches T1 and T2 are spaced apart from each other is greater than 2 μm, there may be a concern that a capacitor capacity may be excessively increased.

The first and second trenches T1 and T2 may have a thickness w equal to or greater than 10 nm in a longitudinal direction.

When the thickness w of the first and second trenches T1 and T2 is less than 10 nm, there may be a concern that ESR may be increased and frequency characteristics may also be affected.

As the thickness w of the first and second trenches T1 and T2 is increased, resistance is advantageously reduced and, thus, an upper limit of the thickness is not particularly limited. However, when the thickness w of the first and second trenches T1 and T2 is excessively high, a manufacturing time for filling the first and second trenches with an internal electrode is long, and thus, the thickness may be limited to an appropriate thickness in consideration of productivity.

The first electrode 121 may be arranged in the first trench T1 and on one surface of the substrate 110. A portion of the first electrode 121, disposed in the first trench T1, may function as an internal electrode and a portion of the first electrode 121, disposed on one surface of the substrate 110, may function as an external electrode along with the first pad electrode 131.

The second electrode 122 may be arranged in the second trench T2 and on one surface of the substrate 110 and may be spaced apart from the first electrode 121. A portion of the second electrode 122, disposed in the second trench T2, may function as an internal electrode and a portion of the second electrode 122, disposed on one surface of the substrate 110, may function as an external electrode along with the second pad electrode 132.

That is, the first electrode 121 and the second electrode 122 may be arranged to face each other across a portion of a substrate in such a manner that portions of the first electrode 121 and the second electrode 122, formed in the first and second trenches T1 and T2, respectively, function as internal electrodes and, thus, may function as a capacitor when voltages with different polarities are applied to the first electrode 121 and the second electrode 122, respectively.

The first and second electrodes 121 and 122 may be formed using an atomic layer deposition (ALD) process. Since the ALD process has excellent step-coverage, easily adjusts a thickness of a thin film, and forms a uniform thin film, even if the thickness w of the trench is small, the first and second electrodes 121 and 122 may be stably formed in the trenches.

The first and second electrodes 121 and 122 may be formed of conductive metal, for example, one of silver (Ag), lead (Pb), platinum (Pt), nickel (Ni), and copper (Cu) or alloys thereof and the present disclosure is not limited thereto.

A distance $l_2$ by which first and second electrodes arranged on one surface of a substrate are spaced apart from each other may be equal to or less than the distance $l_1$ by which the first and second trenches are spaced apart from each other and may be equal to or greater than 150 nm.

When the distance $l_2$ by which the first and second electrodes arranged on one surface of the substrate are spaced apart from each other is greater than the distance $l_1$ by which the first and second trenches are spaced apart from each other, there may be a concern that a current path to the first and second electrodes arranged in the first and second trenches is disconnected and, when the distance $l_2$ is less than 150 nm, current flows directly to the second electrode disposed on one surface of the substrate from the first electrode disposed on one surface of the substrate and, thus, there may be a concern that the first and second electrodes may not function as a capacitor.

The first and second pad electrodes 131 and 132 may be arranged on the first and second electrodes 121 and 122, respectively.

The first and second pad electrodes 131 and 132 may electrically connect the first and second electrodes 121 and 122 to each other and may prevent the first and second electrodes 121 and 122 from being oxidized. For example, the first and second pad electrodes 131 and 132 may be formed of gold (Au).

The passivation layer 140 may be formed to cover the first and second electrodes 121 and 122 and the first and second pad electrodes 131 and 132 and to partially expose the first and second pad electrodes 131 and 132 therethrough.

The passivation layer 140 may protect the first and second electrodes and the first and second pad electrodes and may partially expose the first and second pad electrodes 131 and 132 therethrough to allow voltages with different polarities to be applied to the first and second pad electrodes 131 and 132, respectively.

The passivation layer 140 may be formed of silicon oxide ($SiO_2$) but is not limited thereto.

Figure 3:
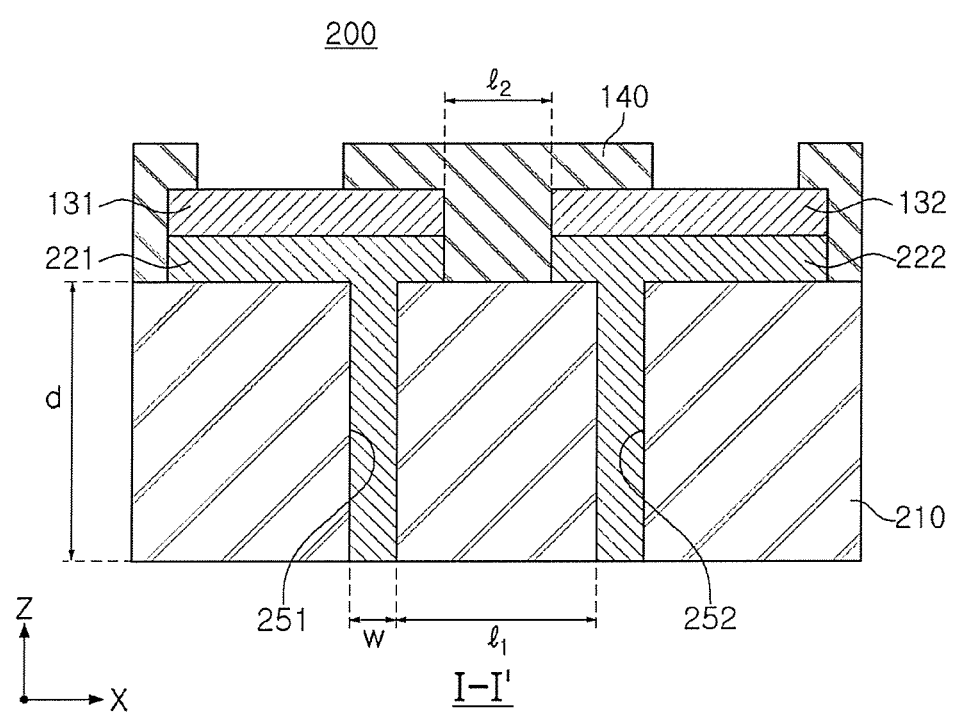
FIG. 3 is a cross-sectional view of a capacitor according to another embodiment of the present disclosure.

FIG. 3 is a cross-sectional view of a capacitor 200 according to another embodiment of the present disclosure.

The capacitor 200 according to another embodiment of the present disclosure may be the same as components of the capacitor of FIG. 1, except that first and second trenches 251 and 252 are formed to penetrate into a substrate 210.

As the first and second trenches 251 and 252 are formed to penetrate into the substrate 210, first and second electrodes 221 and 222 may be partially exposed from a lower surface of the substrate 210.

The first and second trenches 251 and 252 are formed to penetrate into the substrate 210 and, thus, a capacitor size may be further reduced and a trench depth may be adjusted to adjust a capacity of a capacitor.

The aforementioned configured capacitor according to the present disclosure may have a high resonant frequency and a low capacity, and it may be advantageous that the capacitor is manufactured separately from a circuit board and is installed on the circuit board.

An interval between pad electrodes may be minimized and a current path may be minimized, thereby lowering equivalent series inductance (ESL) and equivalent series resistance (ESR) of a capacitor.

Method of Manufacturing Capacitor

FIGS. 4A to 4F are diagrams illustrating a method of manufacturing the capacitor of FIGS. 1 and 2 for respective operations.

Figure 4A:
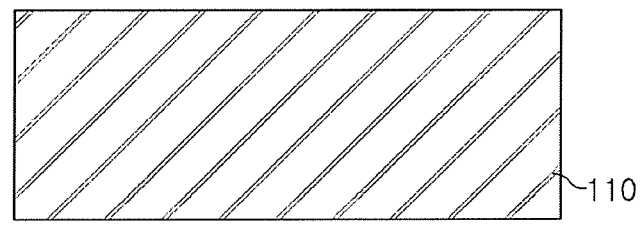
FIGS. 4A to 4F are diagrams illustrating a method of manufacturing the capacitor of FIG. 1 for respective operations.

Referring to FIGS. 4A to 4F, the manufacturing method of the capacitor according to the embodiment of FIG. 1 may be begun by preparing a substrate 110 (FIG. 4A).

Figure 4B:
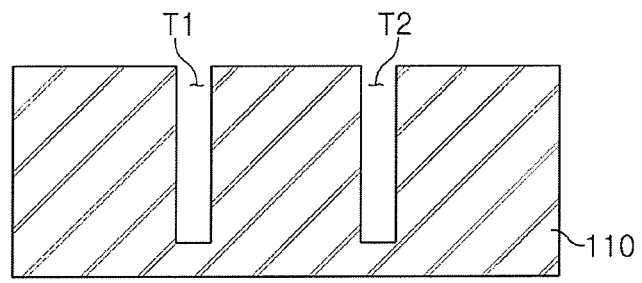

Then, the first and second trenches T1 and T2, spaced apart from each other, may be formed on the substrate 110 (FIG. 4B). The first and second trenches T1 and T2 may be formed by etching one surface of the substrate 110.

A depth d of the first and second trenches T1 and T2, a length (not shown) of the trench in a width direction (Y-axis direction), and the distance 11 by which the first and second trenches are spaced apart from each other may be designed in consideration of a requested capacitor capacity, a package thickness, and so on.

Figure 4C:
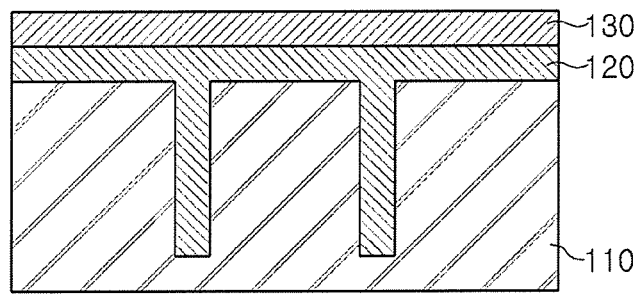

Then, an electrode 120 may be formed in the first and second trenches T1 and T2 and on one surface of the substrate 110 and a pad electrode 130 may be performed on the electrode 120 (FIG. 4C).

The electrode 120 may be formed using an atomic layer deposition (ALD) process. The ALD process has excellent step-coverage, easily adjusts a thickness of a thin film, and forms a uniform thin film, even if the thickness w of the trench is small, the electrode 120 may be stably formed in the trenches T1 and T2.

Figure 4D:
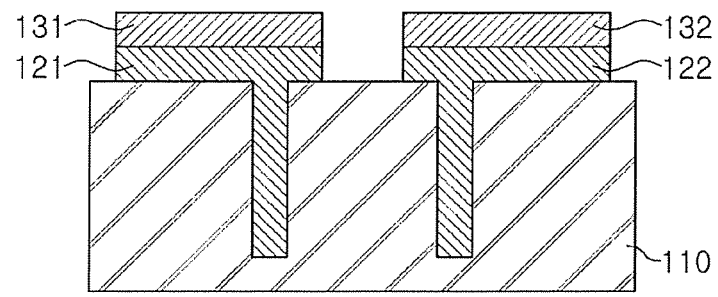

Then, the pad electrode 130 may be partially removed to be divided into the first and second pad electrodes 131 and 132, and the electrode 120 may be partially removed to be divided into the first and second electrodes 121 and 122 (FIG. 4D). The pad electrode 130 and the electrode 120 may be removed using a photo resist process or an etching process.

Figure 4E:
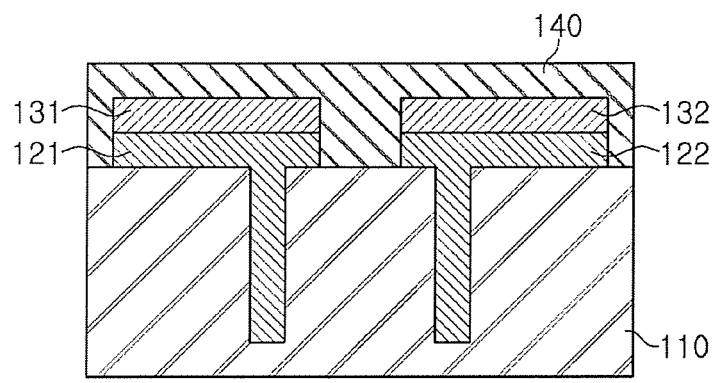

Then, the passivation layer 140 may be formed to cover the first and second electrodes 121 and 122 and the first and second pad electrodes 131 and 132 (FIG. 4E).

Then, the passivation layer 140 may be partially removed to form openings H1 and H2 to partially expose the first and second pad electrodes 131 and 132 (FIG. 4F) so as to complete the capacitor of FIG. 1. The passivation layer 140 may be removed using a photo resist process.

Figure 4F:
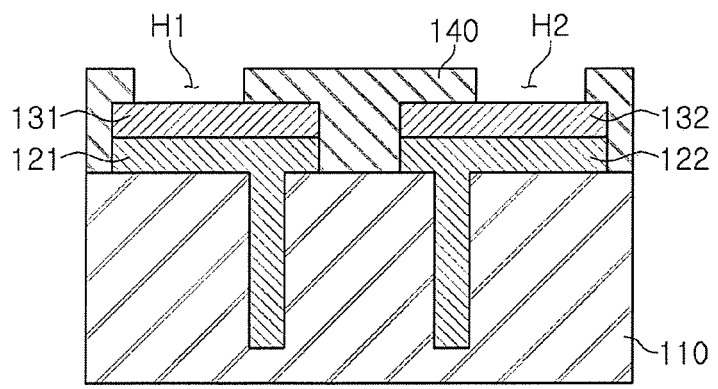
Figure 4G:
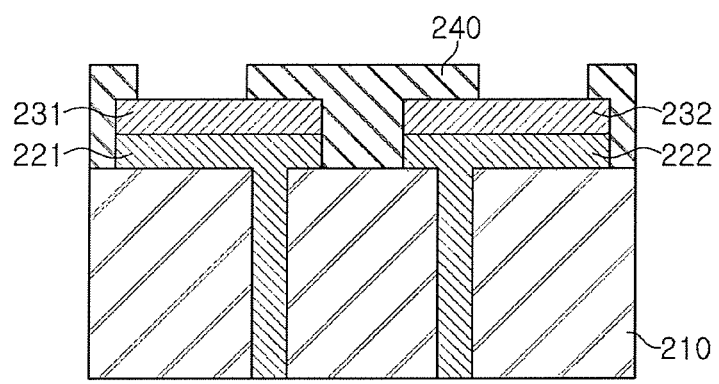
FIG. 4G is a diagram illustrating an additional process for manufacturing the capacitor of FIG. 3.

FIG. 4G is a diagram illustrating an additional process for manufacturing the capacitor 200 of FIG. 3.

As shown in FIG. 4F, after the capacitor 100 of FIG. 1 is completed, grinding a surface opposing one surface of the substrate, on which the passivation layer is formed, may be additionally performed, as shown in FIG. 4G.

The capacitor 200 of FIG. 3 configured in such a way that a trench penetrates into a substrate may be obtained via a grinding process, and after the first and second electrodes are exposed, the grinding process may also be additionally performed to adjust a depth of the trench, thereby adjusting a capacity of a capacitor.

The present disclosure may provide a high-frequency RF matching capacitor that has a high resonant frequency and a low capacity, is separately manufactured from a circuit board, and is installed on the circuit board.

The present disclosure may also provide a capacitor for minimizing an interval between pad electrodes and minimizing a current path to lower equivalent series inductance (ESL) and equivalent series resistance (ESR).

While exemplary embodiments have been shown and described above, it will be apparent to those skilled in the art that modifications and variations could be made without departing from the scope of the present disclosure as defined by the appended claims.

What is claimed is:

1. A capacitor comprising:
   a substrate including first and second trenches spaced apart from each other and extending from one surface of the substrate;

a first electrically conductive electrode including a first portion disposed in the first trench and a second portion connected to the first portion and disposed on the one surface of the substrate;

a second electrically conductive electrode including a third portion disposed in the second trench and a fourth portion connected to the third portion and disposed on the one surface of the substrate, the second electrically conductive electrode being spaced apart from the first electrically conductive electrode;

a first pad electrode disposed directly on the second portion of the first electrically conductive electrodes;

a second pad electrode disposed directly on the fourth portion of the second electrically conductive electrodes; and a passivation layer disposed on the first and second pad electrodes, and having openings partially exposing the first and second pad electrodes, respectively, wherein the first and second electrically conductive electrodes are in direct contact with the substrate.

2. The capacitor of claim 1, wherein the first and second trenches are spaced apart from each other at a distance of 150 nm to 2 μm.

3. The capacitor of claim 1, wherein the first and second trenches have a thickness of 10 nm or more in a longitudinal direction of the substrate.

4. The capacitor of claim 1, wherein the first and second trenches penetrate through the substrate.

5. The capacitor of claim 1, wherein the first and second electrically conductive electrodes include one of silver (Ag), lead (Pb), platinum (Pt), nickel (Ni), and copper (Cu) or alloys thereof.

6. The capacitor of claim 1, wherein the first and second pad electrodes include gold (Au).

7. The capacitor of claim 1, wherein the substrate includes silicon (Si).

8. A method of manufacturing a capacitor, the method comprising:

preparing a substrate;

forming first and second trenches to be spaced apart from each other in the substrate;

forming an electrode in the first and second trenches and on one surface of the substrate, and forming a pad electrode on the electrode;

removing a portion of the pad electrode to divide the pad electrode into first and second pad electrodes, and removing a portion of the electrode to divide the electrode into first and second electrodes;

forming a passivation layer to cover the first and second pad electrodes; and removing portions of the passivation layer to partially expose the first and second pad electrodes.

9. The method of claim 8, wherein the electrode formed in the first and second trenches and on the one surface of the substrate is formed using an atomic layer deposition process.

10. The method of claim 8, further comprising, after the portion of the passivation layer is removed, grinding a surface opposing the one surface of the substrate, on which the passivation layer is formed.

11. The method of claim 10, wherein the first and second trenches are exposed by the grinding.

12. The capacitor of claim 1, wherein the first portion of the first electrically conductive electrode disposed in the first trench is in direct contact with the substrate, and the third portion of the second electrically conductive electrode disposed in the second trench is in direct contact with the substrate.

13. The capacitor of claim 12, wherein the second portion of the first electrically conductive electrode disposed on the one surface of the substrate is in direct contact with the substrate, and the fourth portion of the second electrically conductive electrode disposed on the one surface of the substrate is in direct contact with the substrate.

14. The capacitor of claim 1, wherein a portion of the substrate, as only one layer, is disposed directly between the first and second electrically conductive electrodes.

15. The capacitor of claim 1, wherein only one material is disposed between the first and second electrically conductive electrodes.

16. A capacitor comprising:

a substrate including first and second trenches spaced apart from each other;

a first electrode disposed in the first trench and on one surface of the substrate;

a second electrode disposed in the second trench and on the one surface of the substrate, and spaced apart from the first electrode;

first and second pad electrodes arranged on the first and second electrodes, respectively; and a passivation layer disposed on the first and second pad electrodes, and having openings partially exposing the first and second pad electrodes, respectively, wherein the first and second trenches are spaced apart from each other at a distance of 150 nm to 2 μm.

* * * * *